United States Patent [19]

Menlove

[11] 4,362,394

[45] Dec. 7, 1982

[54] TIME INTERVAL MEASUREMENT ARRANGEMENT

[75] Inventor: Robert P. Menlove, Aberdeen, Scotland

[73] Assignee: Marconi Instruments Limited, Chelmsford, England

[21] Appl. No.: 287,586

[22] Filed: Jul. 28, 1981

[30] Foreign Application Priority Data

Sep. 30, 1980 [GB] United Kingdom ................ 8031492

[51] Int. Cl.[3] ......................... G04F 8/00; G01R 23/16

[52] U.S. Cl. ................................ 368/118; 324/77 A; 324/78 R; 328/110

[58] Field of Search ................................ 368/118-120; 324/77 R, 77 A, 78 R, 78 D; 328/108, 110, 115

[56] References Cited

U.S. PATENT DOCUMENTS 3,889,189 6/1975 Lode .................................. 368/118

4,162,637 7/1979 Brearlet et al. ................. 324/78 D 4,242,637 12/1980 Ferguson .......................... 328/110

*Primary Examiner*—Vit W. Miska

*Attorney, Agent, or Firm*—Spencer & Kaye

[57] ABSTRACT

A time interval measurement arrangement allows extremely accurate measurements to be performed on a complex repetitively recurring waveform. The need arises to perform such measurements in connection with television waveform calibration instruments. The time interval measurement is performed in terms of an accurate amplitude measurement which identifies the required instant in time on the waveform under test. An amplitude sampling circuit is used which repetitively samples the signal at selected points so as to progressively alter in incremental steps a sample value until it is brought into agreement with the actual value of the signal. This process removes the effect of jitter and noise from the measurement process and enables great accuracy to be achieved.

6 Claims, 10 Drawing Figures

TIME INTERVAL MEASUREMENT ARRANGEMENT

This invention relates to a time interval measurement arrangement in which the beginning and/or the end of an interval is defined in terms of an amplitude property of an electrical signal. The amplitude property may be a specific amplitude value or it may be a maxima or minima, for example, whose exact amplitude value is not or need not be known. The invention is particularly suitable for very accurate time interval measurements which are performed in connection with stable repetitive waveforms, which may have a relatively low signal to noise ratio.

According to this invention a time interval measurement arrangement includes means for receiving a signal having a repetitively recurring waveform; means for determining the amplitude of the waveform at a selected point on the waveform by repetitively sampling the signal at said selected point so as to progressively alter in incremental steps the sample value to bring it into agreement with the value of the signal at said selected point, means for varying the sampling instant so as to alter said selected point until the measured amplitude agrees with a predetermined amplitude condition; and means for determining the sampling instant when said agreement is obtained.

The amplitude condition may be a predetermined amplitude level or it may be a function of another amplitude level or it may be defined in terms of the profile of a waveform. Specific examples of these alternatives are described subsequently.

Figure 3:
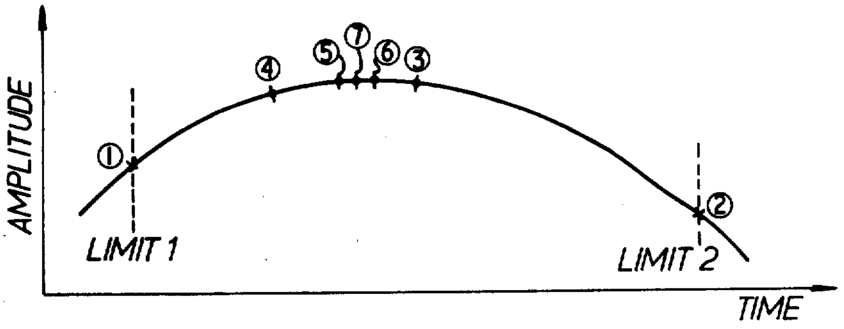
Figure 4:
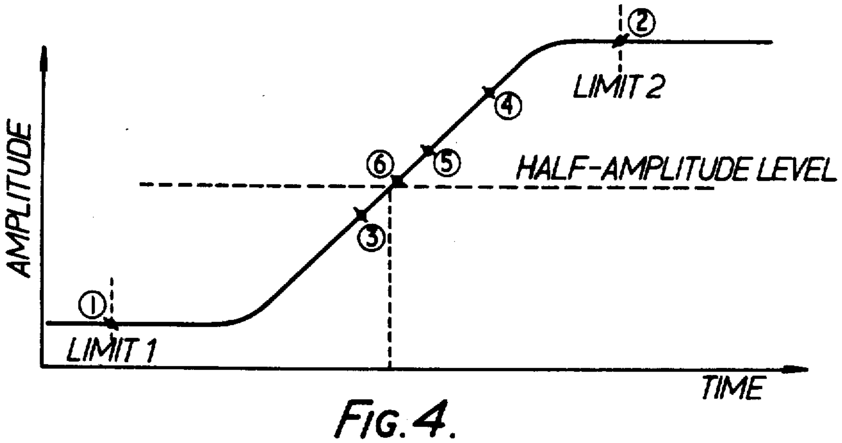
Figure 5:
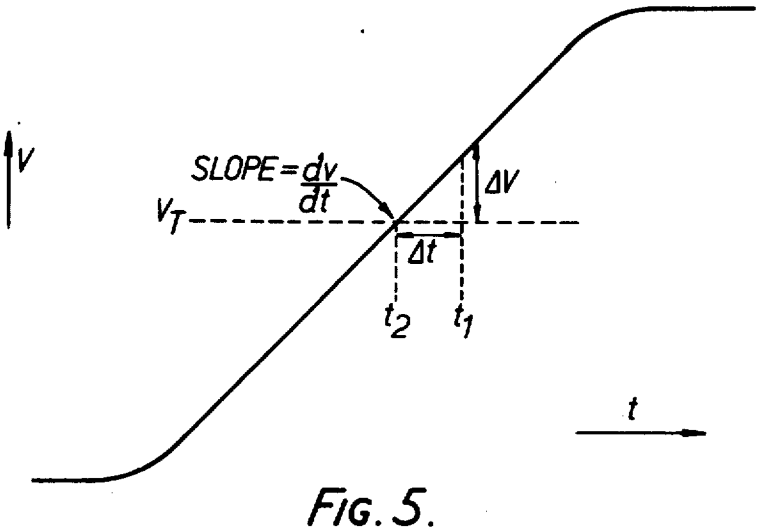
Figure 6:
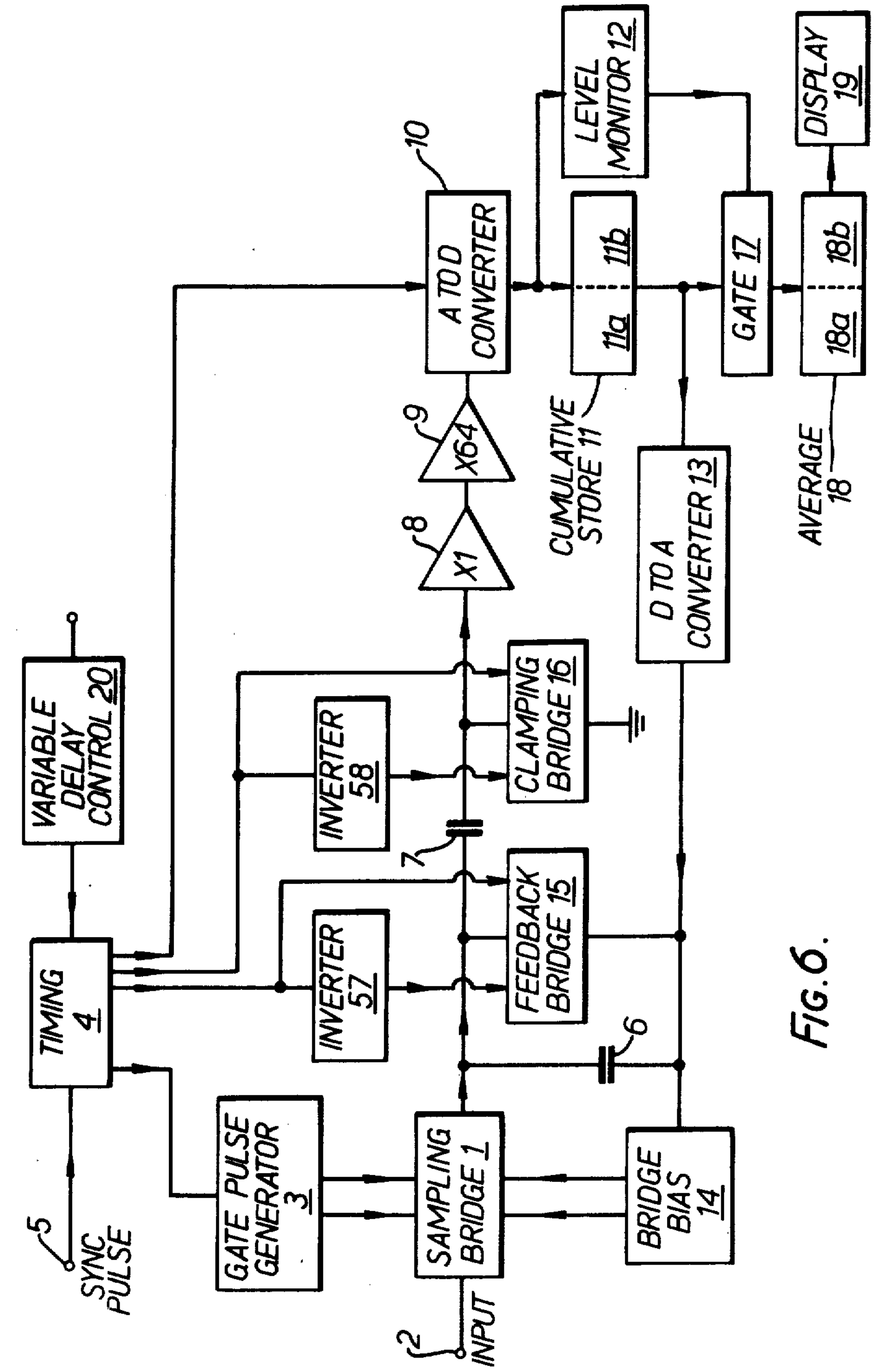
Figure 7:
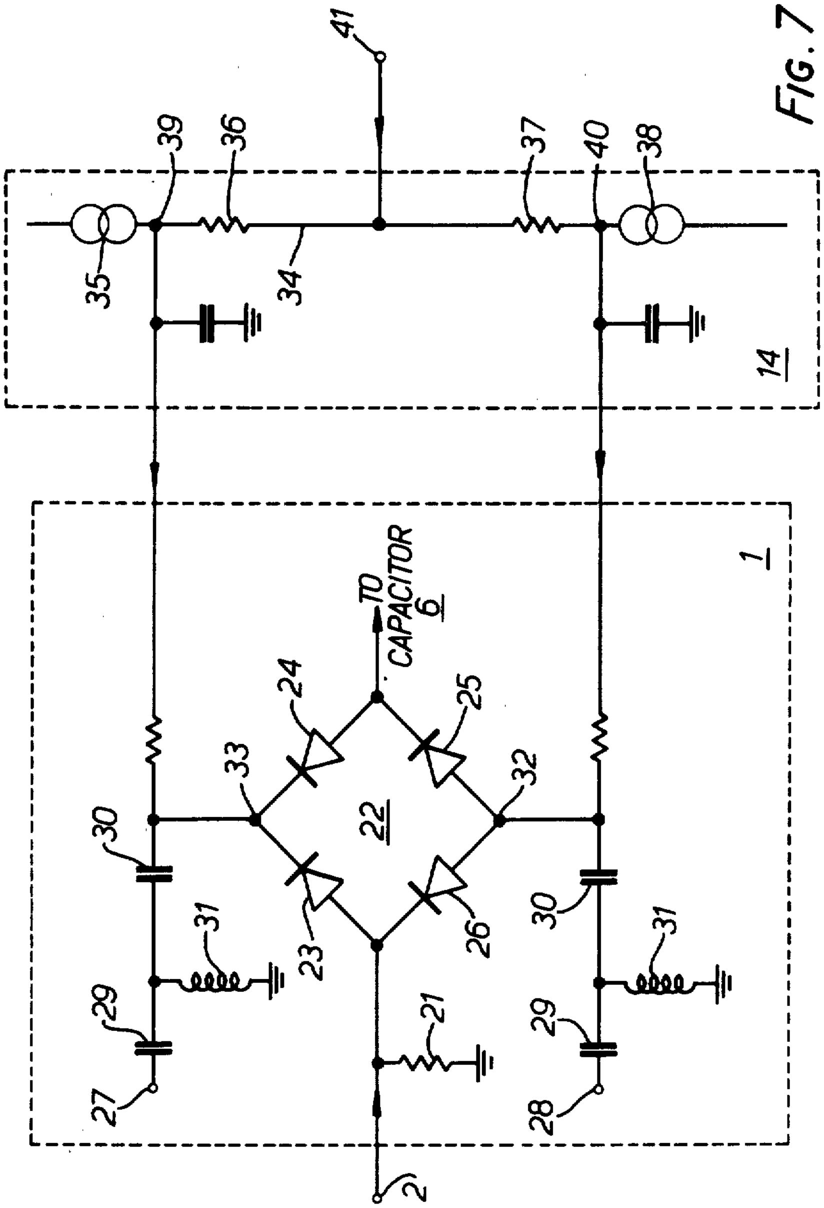
Figure 8:
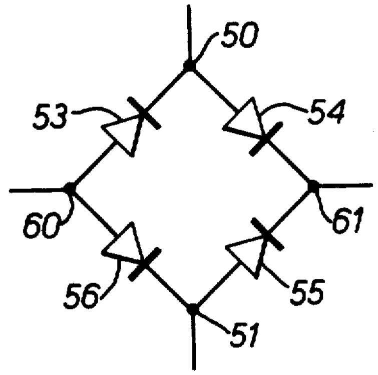
Figure 9:
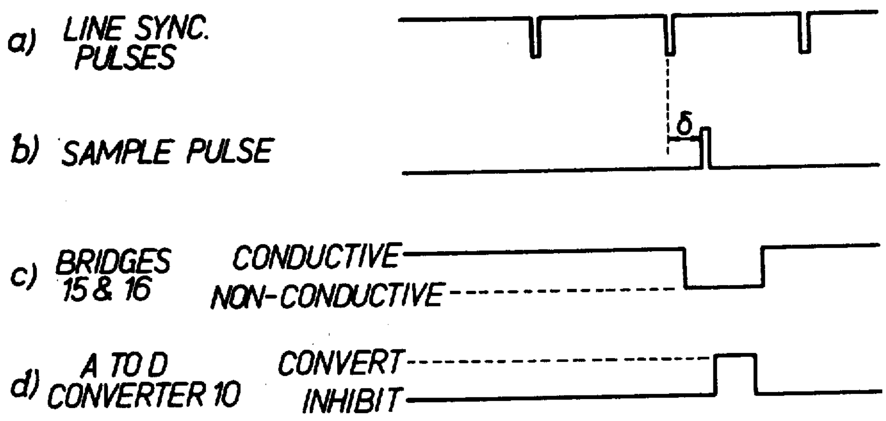
Figure 10:
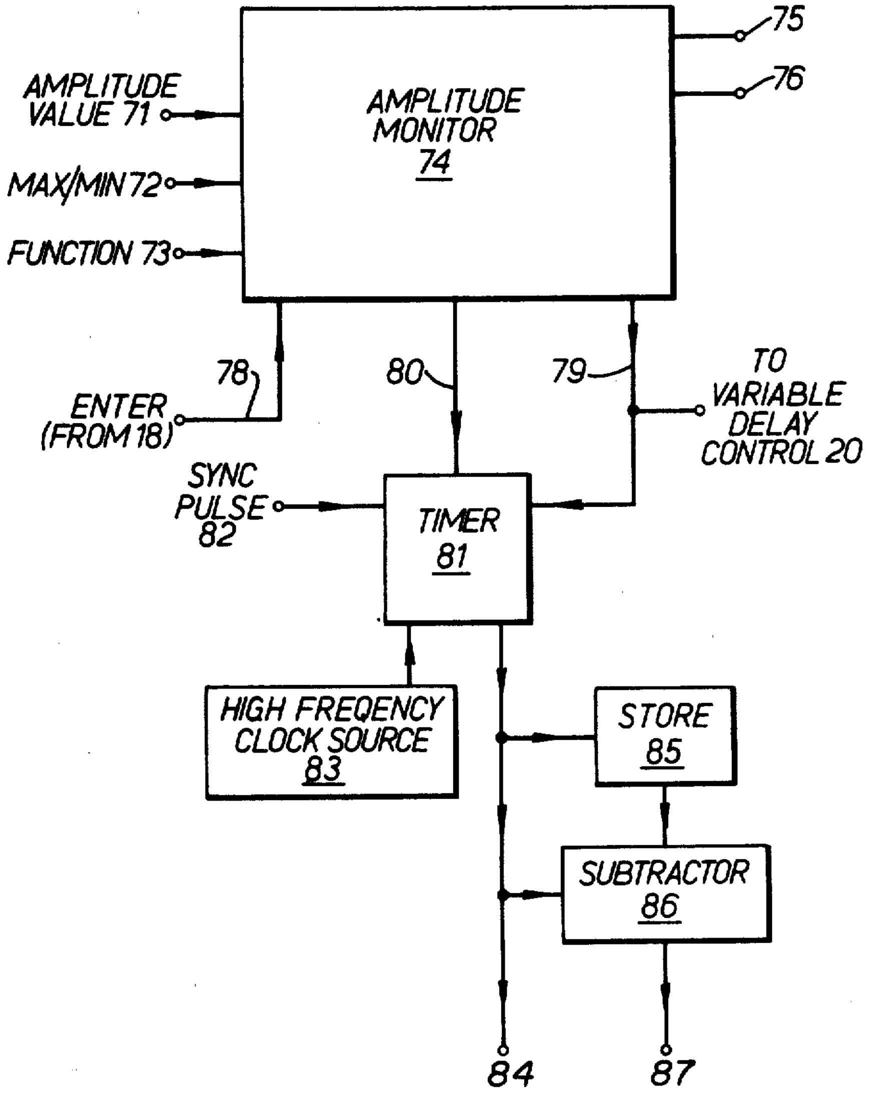

The invention is further described by way of example with reference to the accompanying drawings in which, FIGS. 1, 2, 3, 4 and 5 are explanatory diagrams relating to the use of amplitude measurement to determine time intervals, FIG. 6 illustrates an amplitude measurement circuit forming part of the present invention, FIGS. 7 and 8 illustrate portions of FIG. 5 in greater detail, FIG. 9 is an explanatory diagram relating to the operation of FIG. 6 and FIG. 10 shows part of a time interval measurement circuit in accordance with the present invention.

The invention is particularly suitable for performing very accurate measurements on repetitively recurring electrical signals such as television waveforms which recur at line field of frame frequencies. A television waveform contains not only picture information, but also specially inserted waveforms known as insertion test signals which enable the quality of the television signal to be measured. Careful measurement of the waveform can impart valuable information about the nature of the path over which the signal is sent and the degree of distortion which it introduces. Television signals contain high frequency components and it is important that the profiles of the particular frequency components of the waveform are very accurately known and controlled. Relatively minor errors in amplitude or timing can seriously degrade the quality of a television picture and the operation of a television monitor. For this reason specialised test equipment is available to generate the television waveforms and to monitor the degradation of the waveform which occurs when it has been passed over the whole or part of a television transmission link. It is, of course, necessary to calibrate the specialised test equipment and in order to establish sufficient confidence in the accuracy of the test equipment, it is calibrated to an accuracy which is at least an order of magnitude greater than the accuracy of the final measurements which it is required to perform. The present invention is suitable for performing measurements on the calibration equipment itself.

It is often necessary to know the time of occurrence of a signal pulse or the incident at which the amplitude of a waveform passes through a threshold value. It can be very difficult to perform such measurements accurately because the waveform invariably contains superimposed noise or jitter to a greater or lesser extent. It can be rather tedious to perform such measurements manually by means of a system in which an operator observes a waveform on a display screen, such as is usually provided with an oscilloscope. Futhermore, measurements cannot be performed to the required degree of accuracy in a reliable and consistent manner. The arrangement which is in accordance with the present invention utilises a sampling pulse to sample the amplitude of the signal waveform at a predetermined point. The incident at which the sampling pulse occurs is known precisely and this is varied until a required amplitude value is detected. Thus by noting the incident at which the sampling pulse detects the required amplitude, the timing properties of the waveform can be very accurately measured. In a television waveform, synchronisation pulses are included which accurately define the start of a line or frame period and it is frequently necessary to know the time of occurrence of an event on the television waveform in relation to a synchronisation pulse. Consequently, the time measurement of interest is the time interval occurring between the appropriate synchronisation pulse and the sampling pulse which produces the predetermined amplitude value.

Frequently it is desired to know the interval of time which elapses between two predetermined points on a waveform and this can be readily achieved by this invention by noting the time of occurrence of each event with reference to a common marker point, i.e. a common sychronisation pulse. A system of this kind is illustrated with reference to FIGS. 1 and 2.

Figure 1:
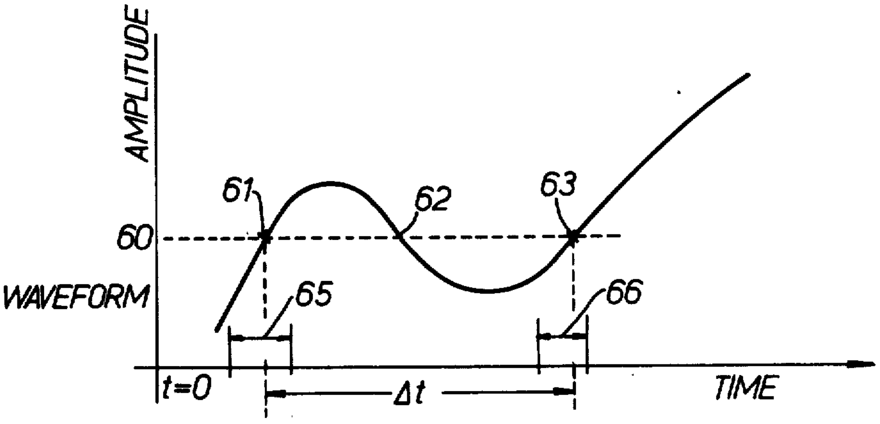
Figure 2:
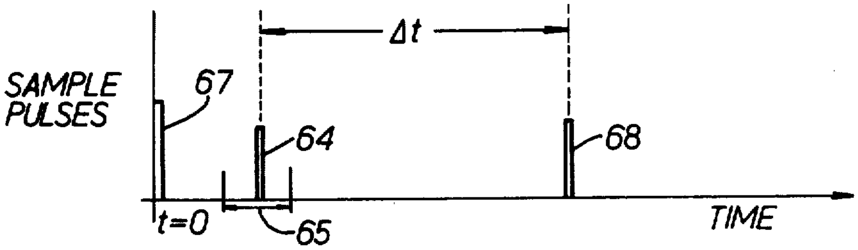

FIG. 1 illustrates a repetitively recurring waveform, which passes through a particular amplitude value 60 on three occasions at points 61, 62, 63 and it is assumed that the time interval between the point 61 and point 63 is to be measured. With reference to FIG. 2, a sampling pulse 64 is used to sample the waveform at a variably selectable time. The sampling pulse 64 is very approximately aligned in time with the point 61 and the amplitude measurements which are obtained are compared with the required threshold value 60. The exact position of the point 61 can be determined in a number of ways, but to avoid gross error the sampling pulse 64 is allowed to occur only within a relatively narrow window. In FIGS. 1 and 2, these are windows 65 and 66 respectively for sampling pulses 64 and 68. If the window is relatively narrow, the position of the sampling pulse 64 and 68 can be incremented steadily from one side of the window to the other, until the required amplitude threshold value 60 is detected. Alternatively, if the approximate profile of the waveform in the vicinity of the point 61 is known, the sampling instant can be controlled by appropriate instructions; for example, if at any instant the sampled amplitude value is less than the threshold value 60, then for a positive-going waveform transition the sampling instant should be delayed or vice versa.

In each case, the instant of occurrence of the sampling pulse 64 is accurately known relative to a synchronisation pulse 67, which in FIG. 2 occurs at time t=0. By determining the time interval which occurs between the synchronisation pulse and the sampling pulses 64 and 68 respectively, which correspond to the points 61 and 63, the time interval Δt between the occurrence of the two points can be easily and simply calculated. It will be noted that very little operator intervention is required, as in this example, it is merely necessary to position the two windows 65 and 66 in an approximate manner. In some cases, it may not be necessary even for this, since if a particular amplitude value occurs only once in a waveform, it is merely necessary for the sampling pulse to search for that value.

The required time interval may be known only in terms of an amplitude condition of the signal waveform. For example, it may be required to identify and measure the position of a peak (maxima) of trough (minima) of the waveform. Such a situation is illustrated in FIG. 3 and the peak value ⑦ is found in an iterative manner. The window corresponds to the interval between points ① and ② and the amplitude of the waveform is measured at these two extreme points. The amplitude is next measured at point ③ which lies midway between points ① and ② and at subsequent points which lie mid-way between the two previous points which represent the greatest amplitudes. This process is continued until the peak value is found. When the peak is found, its position is very accurately and precisely known, since the instant of the sampling pulse is known. The accuracy of the measurement depends only on the accuracy with which the sampling pulse can be positioned, providing, of course, that the measurement of amplitude is not itself affected by noise or jitter. The way in which amplitude measurements are performed to avoid this difficulty is described subsequently with particular reference to FIG. 6.

FIG. 4 shows yet another amplitude condition in which it is required to find the position of the half amplitude level of the rising edge of a pulse. The limits of the window are set so as to to occur on horizontal portions of the waveform, which are well away from the rising edge itself. The mid point is found by an iterative process similar to that described with reference to FIG. 3.

Once the sample pulse has settled to the correct position on the waveform after a number of cycles of the iterative process, the effects of noise may be eliminated by averaging the position of the sample pulse over a large number of samples.

This averaging technique is described subsequently in detail with reference to the operation of the circuit shown in FIG. 6.

This is achieved by maintaining a feedback signal to the sampling circuit to represent the desired threshold level relative to some reference level on the waveform e.g. point ① in FIG. 4. The reference level may be monitored throughout the averaging period by a sample interleaving process described subsequently so that the reference level can be automatically adjusted to follow any d.c. drift which may occur on the signal during the averaging period and which could otherwise introduce errors in the threshold level. After each sample is taken at the threshold level, the signal which represents the difference in voltage between the signal level at the sampling instant and the feedback signal is used to alter the setting of the sample pulse timing in readiness for the next sampling cycle at the threshold level.

So that the setting of the sample pulse timing is altered in the correct sense, dependent on the polarity of a signal representing the previous sample, it must be known whether the slope of the waveform as it passes through the threshold level is positive or negative. In addition the approximate magnitude of the slope should be known so that the adjustment in sample pulse timing is in approximately the correct proportion relative to the voltage level error to ensure that the system is operating at its optimum sensitivity. This information can either be provided by appropriate instructions from prior knowledge of the waveform, or can be found by taking preliminary measurements of the waveform using the sampling system in the vicinity of the required portion of the waveform selected by the window 65 or 66.

This is illustrated by the example of FIG. 5 where the slope of the waveform in the vicinity of the threshold voltage $V_T$ is dV/dt.

If for a single sample at time $t_1$ the sample value differs from $V_T$ by an amount ΔV, which may be due to noise on the signal, then the setting of the sample pulse timing must be altered so as to position the next sample pulse at time $t_2=t_1-\Delta t$, $$\text{where } \Delta t = \frac{\Delta V}{\left(\frac{dV}{dt}\right)}$$

Since Δt is proportional to ΔV and may be either polarity, the distributions of Δt and ΔV about their mean values are the same and if sufficient samples are taken such that the mean ΔV is zero, then it follows that the mean Δt is also zero and therefore the average value of t represents the true position of the waveform at the threshold value $V_T$.

Thus, the process provides the ability to average out the effects of noise to find the true mean position of the selected level on the waveform, irrespective of the magnitude or polarity of the slope of the waveform as it passes through that level.

FIG. 6 shows in block diagrammatic form a sampling measurement system, which is particularly suitable for performing very accurate amplitude measurements on specified portions of a television waveform. The television video signal is applied to a sampling bridge 1 via an input terminal 2. The nature of the sampling bridge 1 is described in greater detail subsequently with reference to FIG. 7, but briefly the sampling bridge operates as a gate under the control of a gate pulse generator 3, which in effect opens the gate at an instant in time determined by a timing circuit 4. Synchronisation pulses are applied via an input terminal 5 at the television line frequency to the timing circuit 4. On receipt of the gating pulses from the gate pulse generator 3, the sampling bridge 1 becomes conductive for a short period and allows a storage capacitor 6 to charge to the sample value. Because the period for which the sampling bridge 1 is conductive is made extremely short, typically of the order of a nanosecond, the capacitor 6 does not necessarily fully charge to the level of the sampled video signal. The sample value held on the storage capacitor 6 is passed via a coupling capacitor 7 to a buffer amplifier 8, which has unity gain. The voltage is subsequently amplified by a further amplifier 9 having an accurately pre-set gain, in this case a gain of sixty-four. After amplification the analogue signal is passed to an analogue-to-digital converter 10, which is of relatively low accuracy, but fast operation. In the present context this means that the converter 10 is typically an eight-bit converter even though an accuracy corresponding to possibly sixteen bits is ultimately required. The use of an eight-bit converter allows the voltage coupled via the capacitor 7 to be rapidly converted to digital form.

It will thus be apparent that the analogue-to-digital converter 10 does not provide as an output a digital word which is accurately representative of the amplitude of the sampled video signal on the first occasion that the signal is sampled. The digital word produced by the converter 10 is passed into a cumulative store 11 and also to a level monitor circuit 12. The cumulative store 11 operates to add the most recently received digital word the contents already in the store. The cumulative sum held in the store 11 is then passed via a digital-to-analogue converter 13 to a feedback bridge 15, to a bridge bias circuit 14 and to the lower end of the storage capacitor 6. The feedback bridge 15 is so arranged that the capacitor 6 is forced to maintain the level of the contents of the cumulative store 11 between sampling instants and is therefore not allowed to discharge with the leakage current of the sampling bridge 1 and the leakage current of the coupling capacitor 7. The same voltage applied to the lower end of the storage capacitor 6 prevents leakage through the storage capacitor 6 between sampling instants and also minimises leakage through the storage capacitor 6 during the sampling and analogue-to-digital conversion period for which time the feedback bridge 15 is non-conductive. The bridge bias circuit 14 operates to provide to the sampling bridge 1, two bias signals which are fixed, one positive and one negative, with respect to the level of the contents of the cumulative store 11. This ensures that the sampling bridge 1 is correctly biassed.

The feedback bridge 15 consists simply of four diodes 53, 54, 55, 56 connected in a bridge configuration as illustrated in FIG. 8, with the drive inputs 60 and 61 being fed from the timing circuit 4 with one of the drive pulses being inverted by an inverter 57. Terminal 50 is connected to the junction between capacitors 6 and 7, and terminal 51 is fed from the converter 13. The operation of the feedback bridge 15 is such that it presents a very high impedance whilst the sampling bridge is conductive so that the capacitor 6 can charge under the influence of the sampled video signal. However, once the sample value has been taken and the sampling bridge 1 has been rendered non-conductive under the control of the gate pulse generator 3, and the analogue-to-digital converter has completed its conversion cycle, the feedback bridge 15 is rendered fully conductive so as to transfer the output of the digital-to-analogue converter 13 to the capacitor 6, so as to maintain its voltage constant between sampling instants.

The clamping bridge 16 is identical to that shown in FIG. 8, but in this latter case the terminal 50 is connected to a point between the capacitor 7 and the amplifier 8, the terminal 51 is connected to earth, and the drive pulses are obtained from the timing circuit 4, with one of the pulses being inverted with respect to the other by pulse inverter 58.

The effect of feedback bridge 15 and the bridge bias circuit 14 is that when the sampling instant occurs, the voltage on the storage capacitor 6 which is representative of the sample value changes only by the difference between its previous value and the new sample value. Of course, if the difference is still fairly large, the capacitor 6 may not actually reach the sample value on the second occurrence but may take many sample periods to accomplish this. The voltage step, i.e. the voltage by which the potential on the storage capacitor 6 changes, is passed by the coupling capacitor 7 and the amplifiers 8 and 9 to the analogue-to-digital converter 10. During the period that the analogue-to-digital conversion is taking place, the feedback bridge 15 and the clamping bridge 16 are rendered non-conductive, so that the voltage received by the converter 10 is not affected by the output of the digital-to-analogue converter 13.

The periodic sampling process continues with the storage capacitor progressively changing its voltage until eventually it reaches the value of the sampled point on the waveform. The level monitor 12 continually monitors the output of the analogue-to-digital converter 10, and when the output of the converter 10 becomes zero or negative the cumulative sum which is held in digital form in the cumulative store 11 is passed via agate 17 and an averaging circuit 18 to terminal 78 and (if desired) to a display 19. The final measurement may be averaged from the output of the cumulative store for many samples to reduce the effect of noise or jitter on the video signal and displayed for as long as is required, after which the setting of the timing circuit may be changed to select a different point on the video signal and the measurement process repeated.

The sampling bridge 1 and the birdge bias circuit 14 are illustrated in greater detail in FIG. 7. The incoming video signal is received via terminal 2 and applied to a diode bridge 22 consisting of four diodes 23, 24, 25 and 26 connected as shown. The output of the bridge 22 is connected to the storage capacitor 6, which corresponds to the capacitor shown in FIG. 6. A resistor 21 is connected between terminal 2 and earth so as to provide a correctly matched termination for the incoming transmission line connected to terminal 2. The sampling bridge is rendered conductive and non-conductive as required under the action of gating pulses applied to terminals 27 and 28 by the gate pulse generator 3. These pulses are coupled to the diode bridge 22 via filters comprising capacitors 29 and 30 and inductor 31. The filters provide a low impedance path to earth at the junction points 32 and 33 for the higher frequency components of the input signal at terminal 2, which would otherwise be transmitted via the stray capacitances of the diodes 23, 24, 25 and 26 to the storage capacitor 6 causing significant errors in the sampled valve during the conversion period of the analogue-to-digital converter 10, i.e. when diodes 23 to 26 are non-conductive. The sampling bridge 1 is biassed by means of a constant current path 34, which flows from a constant current source 35 through matched resistors 36 and 37 to a second current source 38. This provides bias points 39 and 40 by means of which the diodes 23 to 26 can be biassed under the control of the output of the digital-to-analogue converter 13 which is applied to terminal 41. In this way, the diodes can be initially biassed to a level which is dependent on the voltage actually present on the capacitor 6. In particular both the forward transmission characteristics of the four diodes forming the sampling bridge 1 and the reverse bias conditions of the two output diodes 24, 25 of the sampling bridge remain constant even though the sampled level on the video signal at terminal 2 and the sample value stored by the capacitor 6 may change for different sampling points on the video signal.

Under normal circumstances the diodes 23 to 26 are non-conductive, but on the occurrence of the gating pulses at terminals 27 and 28, they are rendered momentarily conductive allowing capacitor 6 to be charged by the video signal present at terminal 2. The duration of the gating pulse is very short, and is typically of the order of a nanosecond.

The sequence of events is more clearly indicated in FIG. 9 in which the synchronisation pulses received at terminal 5 are illustrated in line a. It is assumed that a television video waveform is received at terminal 2 and that the synchronisation pulses are composite pulses to enable the line being sampled to be identified and to indicate the instant at which a line scan begins. The moment at which the video waveform is sampled by the sampling bridge 1 is determined by a line selector contained within the timing circuit 4 and by the magnitude of a delay produced by a variable delay circuit 20. In FIG. 9, this delay is indicated by the symbol $\delta$ and it will be seen that shortly before the occurrence of the gating pulses, which are illustrated in line b, the feedback bridge 15 and the clamping bridge 16 are rendered non-conductive as indicated in line c. When the feedback bridge 15 is conductive it forces the voltage stored on the capacitor 6 to the value of the digital-to-analogue converter 13, and when the clamping bridge 16 is conductive it clamps the input of the buffer amplifier 8 to a fixed reference voltage, nominally zero. During this period the coupling capacitor 7 charges to an equilibrium condition via the low impedance path presented by the bridges 15 and 16. When the bridges 15 and 16 are rendered non-conductive to enable a new sample to be taken, the charge on the coupling capacitor 7 is maintained thus transmitting to the buffer amplifier 8 the step change in the stored voltage on the capacitor 6 as the latter is charged or discharged in accordance with the amplitude of the video waveform at the instant of sampling. The feedback bridge 15 and clamping bridge 16 are rendered non-conductive for the period required by the capacitor 6 to charge and to transfer the step voltage via the capacitor 7 and amplifiers 8 and 9 to the analogue-to-digital converter 10 and for the analogue-to-digital converter 10 to perform a conversion on the step voltage, this latter event being indicated in line d of FIG. 9. Prior to the instant at which the point on the waveform is next sampled the feedback bridge 15 and the clamping bridge 16 are again rendered conductive so as to maintain the new sample value on the capacitor 6 and reset the input of the buffer amplifier 8 to zero.

Once the conversion has been completed and the cumulative sum held in the store 11 has been up-dated, the new sum value is converted back to an analogue signal by converter 13 to set up the bias of the sampling bridge 1 and the storage capacitor 6 in readiness for the next sample.

It will be apparent from the preceding description that the voltage on capacitor 6 may not reach its final value until the waveform has been sampled repeatedly on a number of successive occasions, and in order to achieve a sufficient degree of accuracy by averaging out any noise present on the input signal or present within the measuring system, it is desirable to sample a large number of repetitions of the applied waveform after the measuring system has settled to its final value. The relatively long period required to complete a particular measurement can be undesirable when it is required to perform comparative level measurements in respect of different points on the repetitively occurring waveform. This consideration applies to time interval $\Delta t$ measurements of the kind shown in FIG. 1. In principle, this could require a very high degree of long term d.c. stability both in the measurement system and in the television signal generator and to reduce this requirement, the system shown in FIG. 6 is arranged to sample two points alternately on successive occurrences of the input waveform. By interleaving the samples any off-set drift which occurs during the integrating time, i.e. the time taken for the required number of sample values to be taken and averaged will affect both sets of samples equally, and will therefore cancel when the difference between the two sets of samples is calculated. To accommodate this mode of operation, the cumulative store 11 is divided into two sections 11*a* and 11*b* with one half of the store handling data relating to the measurement of one point on the waveform and the other half of the store handling data relating to the second point. It is necessary to switch the store at a rate corresponding to the repetition period of the applied video signal but this can be simply achieved under the action of the timing circuit 4 in response to the received synchronisation pulses via terminal 5. Similarly the output of the cumulative store 11 is switched alternately between the two values so that at any instant the output signal provided by the digital-to-analogue converter 13 relates to the point on the waveform which is to be sampled next.

The averaging circuit 18 is also divided into two sections 18*a* and 18*b* in order to calculate the average values of the two sets of data presented by the two sections of the cumulative store 11 over the required integration period.

By eliminating the need to provide perfect d.c. stability over a longer period of time, the integration period for a particular measurement can be extended as necessary in order to minimise the effect of noise on the input signal or in the system. By increasing the integration period, the theoretical accuracy of the comparative measurements can be considerably enhanced.

Although in FIG. 6, the cumulative store 11 and averaging circuit 18 are shown divided into only two sections 11*a*, 11*b* and 18*a*, 18*b* they may be divided into a larger number of sections so as to enable a correspondingly larger number of individual points on the incoming waveform to be measured. For example, if comparative measurements were required for four points on the waveform, then four sections of the cumulative store and averaging circuit would be required with data being entered into a particular section on every fourth occurrence of the waveform.

In some instances it may be possible to replace the feed-back bridge 15 and the clamping bridge 16 by respective resistors having carefully chosen values if the sampling repetition rate is sufficiently low. Alternatively, it is possible in principle to replace the feedback bridge 15, the clamping bridge 16, capacitor 7 and amplifiers 8 and 9 by a two-input differential amplifier, one input of which is connected to the junction point of storage capacitor 6 and the sampling bridge 1, and the other input of which is connected to the converter 13. Such an amplifier could be required to provide the same gain as amplifier 9, and in addition must exhibit a very high common mode rejection characteristic. At present it is believed that the configuration shown in FIG. 6 provides the better results.

The sequence of events described, and partly illustrated in FIG. 9 could be controlled by a suitable sequencing device, or could be achieved under the control of a suitably programmed processing device. Such a device would also control the operation of the converter 10, store 11 and the averaging circuit 18 if desired.

Because the amplitude of the sample value is sampled a large number of times once brought into agreement with the amplitude of the selected point on the waveform, the effect of noise and jitter is minimised, as it averages out. This enables very accurate measurements to be performed.

FIG. 10 shows a time interval measurement circuit which utilises the amplitude measurements performed by FIG. 5. The desired amplitude condition is entered via terminals 71, 72, 73 into an amplitude monitor 74. For example, if it is required to search a waveform for a point having a particular value, that value is entered via terminal 71. Similarly, if it is desired to search for a maxima or minima, the instruction is entered via terminal 72 and instructions of the kind which enable a specific amplitude function to be determined are entered via terminal 73. An example of an amplitude function is that shown in FIG. 4 in which the required amplitude function is mid-way between two known amplitude levels. If desired, the window limits within which the amplitude measurement circuit is to search for the required value can be entered at terminals 75 and 76. The amplitude monitor generates a signal which is applied to the variable delay control 20 shown in FIG. 6, and the corresponding amplitude value is obtained via terminal 78 (forming part of FIG. 6) in dependence on the relationship between the detected amplitude value and the required amplitude value as the delay control signal provided over lead 79 is varied. The variable delay control signal is also applied to a timer 81, which receives in addition the synchronisation pulse at terminal 82. These are the same synchronisation pulses as are received at terminal 5 of FIG. 6. When the correct amplitude measurement is detected at terminal 78 by the amplitude monitor 74, the timer 81 is instructed over lead 80 to measure the time interval between the sampling pulse and the synchronisation pulse. The time interval is measured by counting pulses from a very high frequency clock source 83. In effect, the clock source is gated on by the sync pulses and gated off by the occurrence of the instruction pulse on lead 80. The time interval may be provided directly to an output terminal 84 if it is merely necessary to know the time interval of a particular occurrence relative to the synchronisation pulse. However, if a time difference measurement $\Delta t$ of the kind illustrated with reference to FIGS. 1 and 2 is required, the first time measurement is temporarily entered into a store 85, whilst the second time measurement is performed. For example, the first time measurement would correspond to the point 61 in FIG. 1 and the second time measurement would correspond to the point 63. When the second time measurement is obtained, it is subtracted from the store value by a subtractor 86 and the resulting time difference is provided over lead 87 for utilisation as required.

In FIG. 10, the subtractor 86 is shown as subtracting one average value from another average value, where each average value is the result of many samples. In some cases it is better to subtract pairs of non-averaged single sample values, and to average the resulting difference values which are obtained from a large number of subtractions.

I claim:

1. A time interval measurement arrangement including means for receiving a signal having a repetitively recurring waveform; means for determining the amplitude of the waveform at a selected point on the waveform by repetitively sampling the signal at said selected point so as to progressively alter in incremental steps the sample value to bring it into agreement with the value of the signal at said selected point; means for varying the sampling instant so as to alter said selected point until the measured amplitude agrees with a predetermined amplitude condition; and means for determining the sampling instant when said agreement is obtained.

2. An arrangement as claimed in claim 1 and wherein means are provided for averaging a number of sample values after sample value has been brought into said agreement so as to minimise the effect of noise present on the received signal.

3. An arrangement as claimed in claim 1 and wherein said predetermined amplitude condition comprises a predetermined amplitude level relative to a predetermined reference level, and wherein said predetermined reference level and said selected points are repeatedly sampled so that the magnitudes of the corresponding sample values are incremented in sequence until both have been brought into said agreement concurrently.

4. An arrangement as claimed in claim 3 and wherein the difference between said predetermined reference level and the amplitude of said selected point when said agreements have been obtained is measured on a number of successive occasions and an average value produced.

5. An arrangement as claimed in claim 1 and wherein said amplitude condition comprises a maxima or minima on said waveform, the sampling instant being varied in dependence on the result of the preceding measured amplitude until said agreement is obtained.

6. An arrangement as claimed in claim 1, 3 or 5 and wherein each sampling instant (except the first) relating to said selected point is varied so as to lie between those two preceding sampling instants which produced the two measured amplitudes closest to the predetermined amplitude condition.

* * * * *